(12) United States Patent
Korolik et al.

(10) Patent No.: US 7,888,664 B2
(45) Date of Patent: Feb. 15, 2011

(54) PLATE PALLET ALIGNMENT SYSTEM

(75) Inventors: Pavel Korolik, Petah-Tikwa (IL); Moshe Beres, Ness Ziona (IL); Tamir Olpak, Petah Tiqwa (IL); Shay Regev, Rishpon (IL); Mark Silverman, Tel-Aviv (IL)

(73) Assignee: Eastman Kodak Company, Rochester, NY (US)

( * ) Notice: Subject to any disclaimer, the term of this patent is extended or adjusted under 35 U.S.C. 154(b) by 409 days.

(21) Appl. No.: 12/045,058

(22) Filed: Mar. 10, 2008

(65) Prior Publication Data

US 2009/0224464 A1 Sep. 10, 2009

(51) Int. Cl.
*B65H 7/02* (2006.01)
(52) U.S. Cl. .................... 250/559.3; 348/95
(58) Field of Classification Search ............ 250/559.3; 348/95
See application file for complete search history.

(56) References Cited

U.S. PATENT DOCUMENTS 3,639,059 A 2/1972 Strumor et al.
4,408,530 A 10/1983 Yano et al.
4,764,791 A 8/1988 Omata et al.
4,999,669 A 3/1991 Sakamoto et al.
5,031,334 A 7/1991 Takamura
5,367,360 A 11/1994 McIlwraith et al.
5,633,676 A * 5/1997 Harley et al. ............ 348/95
6,283,681 B1 9/2001 Raiteri

FOREIGN PATENT DOCUMENTS

EP 1 980 510 A1 10/2008
WO WO 2006/091558 A1 8/2006

* cited by examiner

*Primary Examiner*—Seung C Sohn
(74) *Attorney, Agent, or Firm*—Nelson Adrian Blish

(57) ABSTRACT

A plate pallet alignment and loading apparatus (10) for originally packed plate pallet (13) into a printing plate imaging device (71) includes plate pallet adaptor (11) wherein the originally packed plate pallet (13) is placed on top; plate pallet position detectors (15, 21, 31) attach to the plate pallet adaptor (11); a pallet alignment and loading apparatus (10) loads the plates from the originally packed plate pallet (13) into the printing plate imaging device; interleaf removal system (16) separates separation paper sheets placed between the plates; and plate pallet position correction actuators (43, 44, 45) corrects the plate pallet position in respect to the plate loading system (14) in response to pallet position results read from the plate pallet position detectors.

13 Claims, 8 Drawing Sheets

PLATE PALLET ALIGNMENT SYSTEM

CROSS REFERENCE TO RELATED APPLICATIONS

Reference is made to commonly-assigned copending U.S. patent application Ser. No. 12/045,061, filed Mar. 10, 2008, entitled PLATE PALLET STOCK DETECTION, by Korolik et al., the disclosure of which is incorporated herein.

FIELD OF THE INVENTION

This present invention relates to an apparatus and methods to properly align originally packed printing plate pallets into a computer to plate imaging device.

BACKGROUND OF THE INVENTION

A variety of systems and applications use stacks of sheets or plates, which may be made of metal, paper, plastic, and the like. Printing plates (hereinafter singly or collectively referred to as "plates") are typically stacked in a cassette or similar container which houses the plates and facilitates their protection, transportation, and handling.

A system for handling printing plates will generally use trays having specific dimensions. Trays can usually be set to contain plates of various sizes, but all plates in the same tray are of one size. The plates may be manually removed from the cassette or the shipping container and inserted into the trays for use by the plate imaging system. Plates packed in cassettes are separated by intermediate paper sheets, hereinafter referred to as 'separation paper.'

U.S. Pat. No. 5,367,360 (McIlwraith et al.) describes a method for loading plates from a single tray. In this case, the cardboard shipping container is used as a tray and the plates are lifted and loaded vertically by a vacuum system.

Trays containing printing plates are heavy and bulky, and moving such trays up and down requires complicated and expensive mechanisms and is time consuming. There is a widely recognized need for an automatic and efficient handling system for feeding plates directly from the original plate pallet into the imaging device, while maintaining precise alignment of the plate during the plate feeding process.

SUMMARY OF THE INVENTION

Briefly, according to one aspect of the present invention a plate pallet alignment device, for loading an originally packed plate pallet into a printing plate imaging device, includes a plate pallet adaptor wherein the originally packed plate pallet is placed on top of the plate pallet adaptor. Plate pallet position detectors detect the position of the originally packed plate pallet and plate pallet position correction actuators correct the plate pallet position with respect to the plate loading system in response to pallet position results read from the plate pallet position detectors. In one embodiment, an interleaf removal system separates the plates from the separation paper sheets placed between the plates;

These and other objects, features, and advantages of the present invention will become apparent to those skilled in the art upon a reading of the following detailed description when taken in conjunction with the drawings wherein there is shown and described an illustrative embodiment of the invention.

DETAILED DESCRIPTION OF THE INVENTION

The present invention describes apparatus and methods to receive a pallet of printing plates in an original manufactured form into a computer to plate (CTP) imaging device. The plate pallet is brought into the CTP device, using regular fork lift machinery. This process introduces inherent position inaccuracies in placing the pallet, in respect to the plate loading system. The plate loading system, on the other hand, requires high precision prerequisites. The invention disclosed hereunder bridges between these two realms. The plate pallet is consumed by an automatic pallet loading (APL) device attached to the CTP device. APL receives the bulk of plates originally packed on a pallet. The pallet, brought into the APL, should be positioned and aligned precisely relative to the plate loading system, in order to allow proper plate loading functionality, directly from the pallet.

The alignment is essential in order to cure for inaccuracies caused by factors such as:
1. Plate packaging tolerance, such as differences between plate to plate positions in the plate pallet itself.
2. Plate movements within the plate pallet during the shipping.
3. Positioning of the pallet on the pallet adaptor.
4. Positioning the adaptor with the pallet inside the APL.

The invention discloses several embodiments of position detection of the plate pallet, and means to correct the position of the pallet and plates, relative to the plate loading system requirements.

Figure 1:
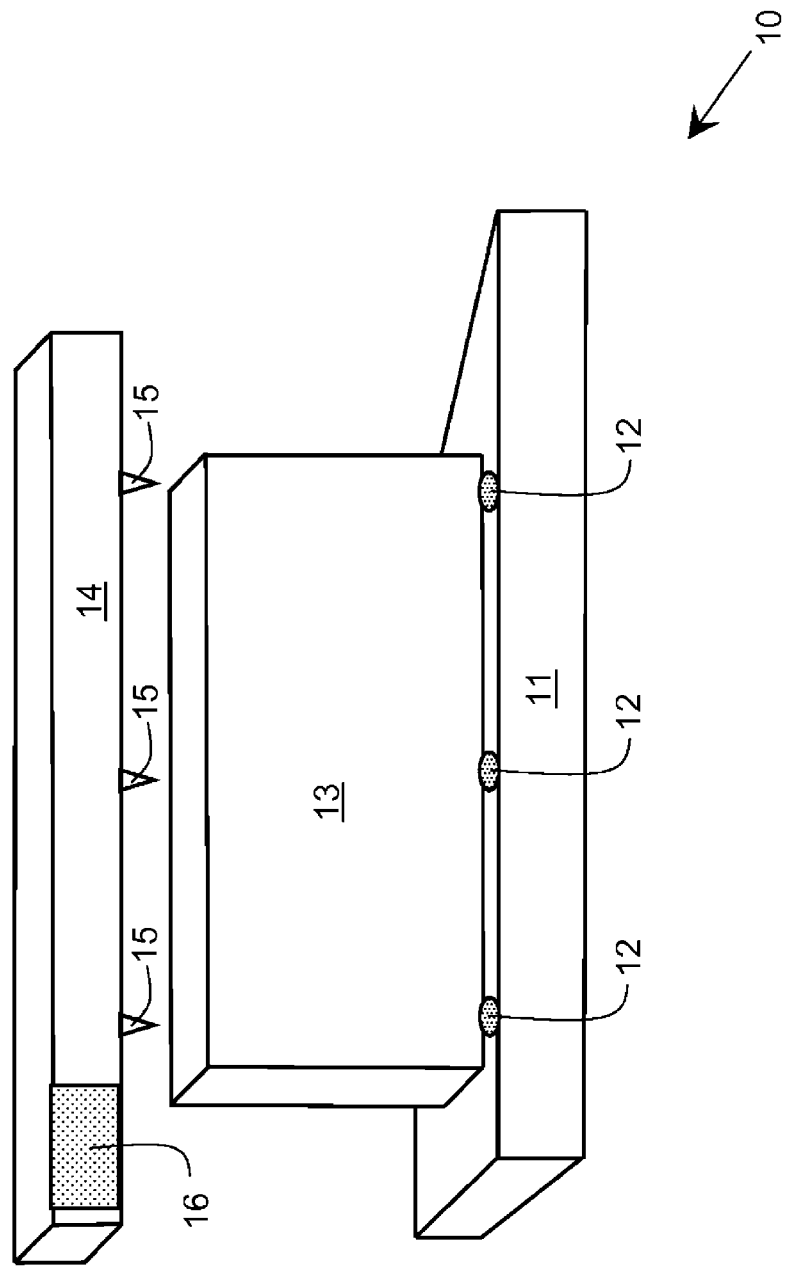
FIG. 1 is a schematic perspective view of a plate pallet positioning detection method using optical detection means.

Referring to FIG. 1, a plate pallet alignment device is referred to in general by numeral 10. A plate pallet 13 is positioned on plate pallet adaptor 11 and brought into the APL. In the APL the plate pallet 13 with plate pallet adaptor 11 is placed on the pallet positioning system 47 (shown in FIG. 4) which is situated underneath the plate loading system 14. The plate pallet is manufactured or equipped by the operator to include three optical position indicators 12 placed on the pallet for further position detection, using optical detection means. Optical detectors 15 are attached to the plate loading system 14, directed towards the position indicators 12. The optical detectors 15 read the position of indicators 12 and thus calculate the required geometrical compensation needed to be applied, in order to correct the plate pallet position in the plane. The information derived from the above detection, is required correction in the axis X, Y and an additional @ angular degree needed to adjust the plate pallet to conform with the plate loading system 14.

Figure 2:
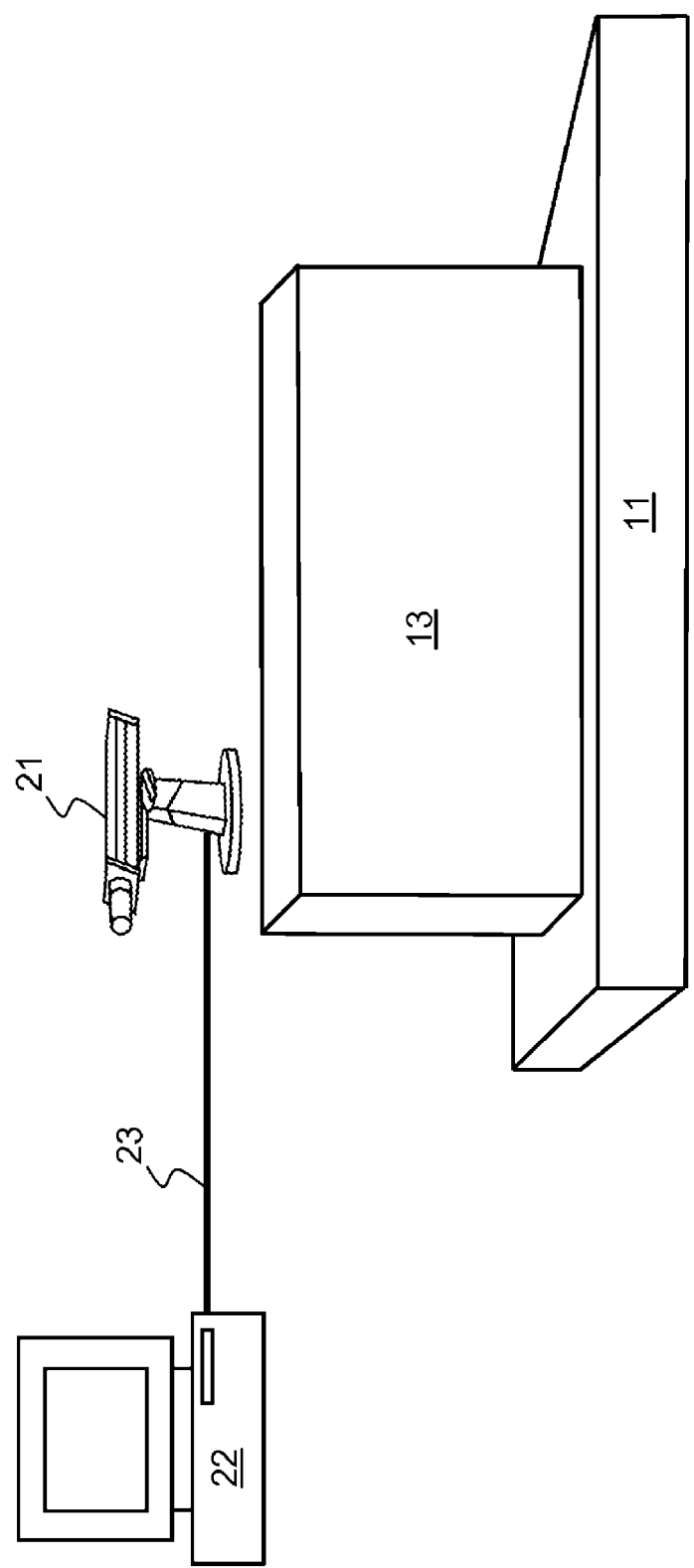
FIG. 2 is a schematic perspective view of a plate pallet positioning detection method using video camera.

An alternative method for plate pallet position detection is illustrated in FIG. 2. A video camera 21 is introduced in order to detect the edges of the plate that resides on top of the plate pallet 13. The video camera 21 is connected to computer 22 via control and data line 23. Computer 22 is configured to control the operation of video camera 21 and receive the captured information from the video camera. The information that is gathered by the video camera 21 is analyzed by the computer 22, such analysis enables reaching at least the following results:

a. Correction of the plate pallet 13 position in respect to the plate loading system 14.

b. Alignment of the top plate (of plate pallet 13) in respect to the plate loading system 14.

c. Detecting the existence of an interleaf separation paper on the top of the plate and thus alerting the system to deploy proper interleaf removal measures by separating the paper from the plate.

d. Measuring plate or interleaf dimensions.

Figure 3:
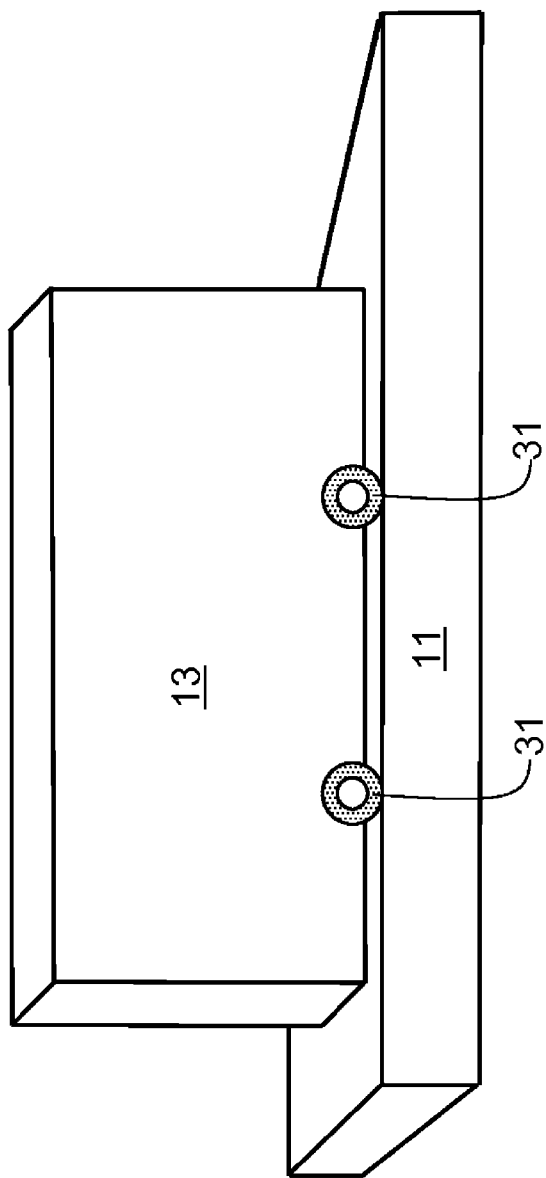
FIG. 3 is a schematic perspective view of a plate pallet positioning detection method using mechanical detectors.
Figure 4:
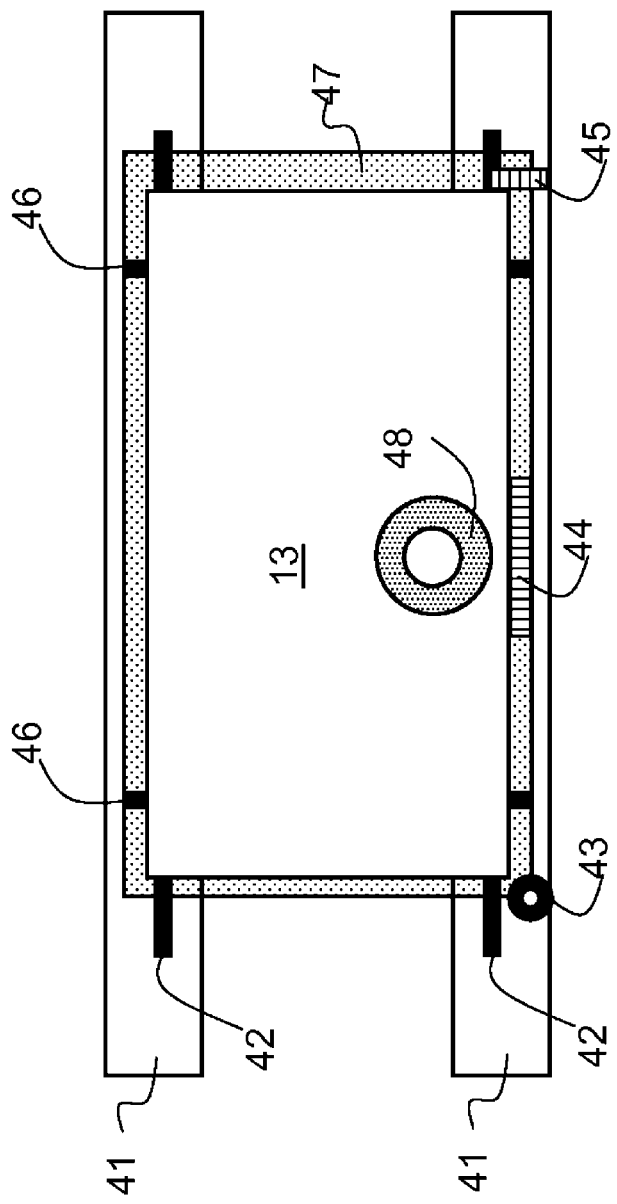
FIG. 4 is a schematic top view of a plate pallet plane alignment system using three motor actuators in conjunction with a track system.
Figure 5:
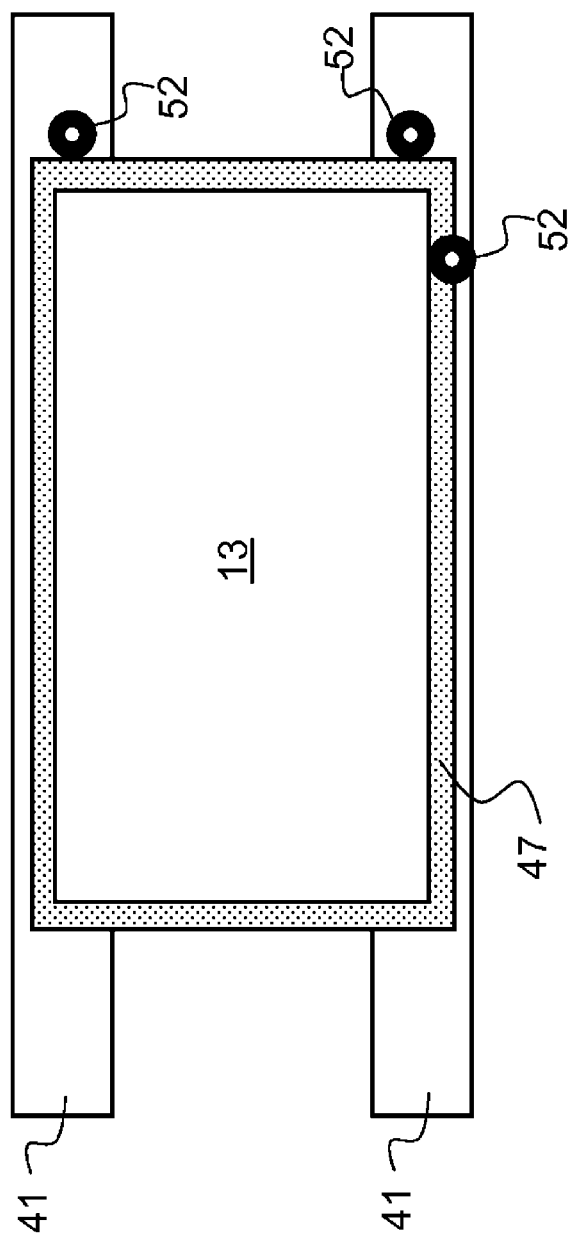
FIG. 5 is a schematic top view of a plate pallet plane alignment system using three motor actuators in conjunction with bearings surface system.

FIG. 3 illustrates detectors 31 (such as mechanical, optical, or induction) used in order to find the plate pallet position inaccuracies. FIG. 4 and FIG. 5 illustrate methods for correcting the plate pallet position to conform to plate loading system 14 requirements.

Referring to FIG. 4, plate pallet 13 is positioned on an elevator top plate. The elevator top plate 41 is part of the pallet positioning system 47 and equipped with three motor actuators. The plate pallet is placed on a pallet positioning system 47 equipped also with a bearings surface and uses guiding tracks (42 and 46) and a rotation axis 48 controlled by angular movement actuator 43.

The X axis actuator 44, compensates for the X axis inaccuracies founded by the previously described position detection methods. The actuator 44 moves the plate pallet 13 to the required position in the respect to X axis, using X axis tracks 42. Y axis actuator 45 compensates for the Y axis inaccuracies, using Y tracks 46. Similarly angular movement actuator 43 compensates by adjusting the elevator top plate 41 by required angle.

Referring to FIG. 5, an alternative method for correcting plate pallet position is introduced. In this case three axis coupled actuators 52 are used. The plate pallet is placed on a pallet positioning system 47, without the need to use guiding tracks (42 and 46). The reposition is performed by the axis coupled actuators 52 causing the pallet to move on the pallet positioning system 47 using a bearings surface to achieve the correct pallet position.

Figure 6:
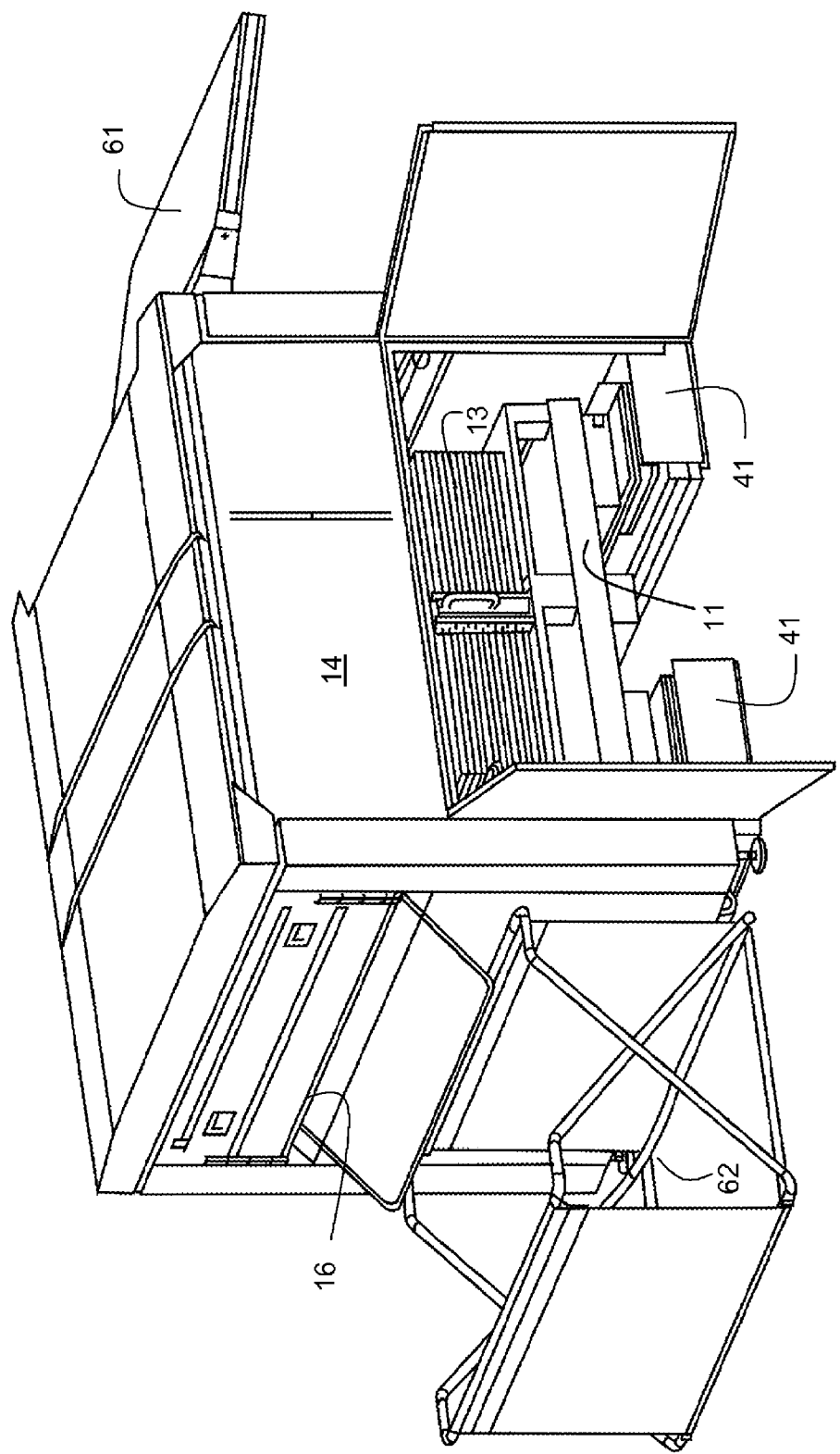
FIG. 6 is a perspective view of an automatic plate loading system.

FIG. 6 describes the plate pallet alignment and loading apparatus in detail. Plate pallet 13 is placed on plate pallet adaptor 11 on top of elevator top plate 41 inside the device. The device places the plate pallet 13 underneath the plate loading system 14.

Figure 7:
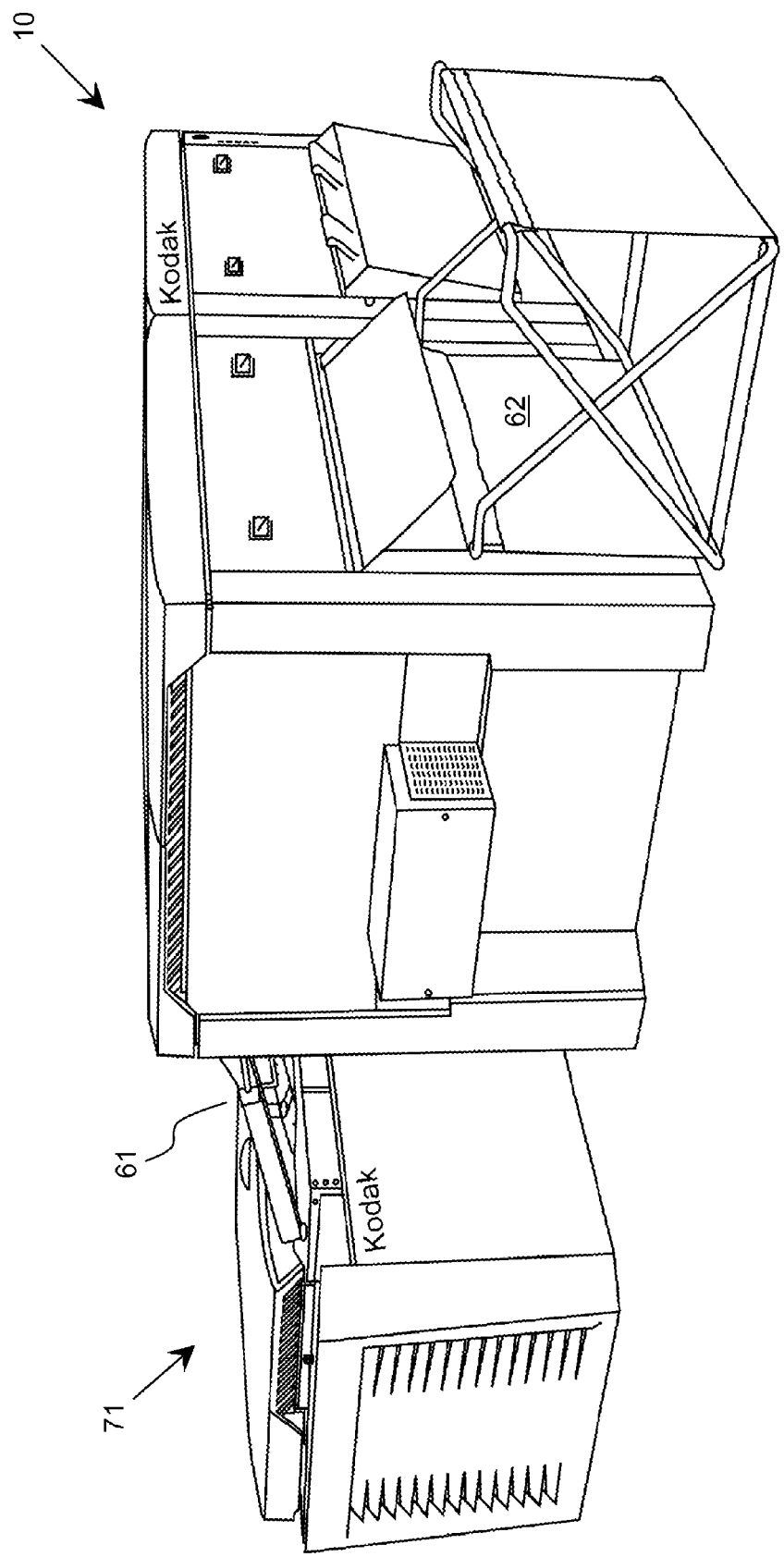
FIG. 7 is a perspective view of an automatic plate loading system connected to a plate imaging device.
Figure 8:
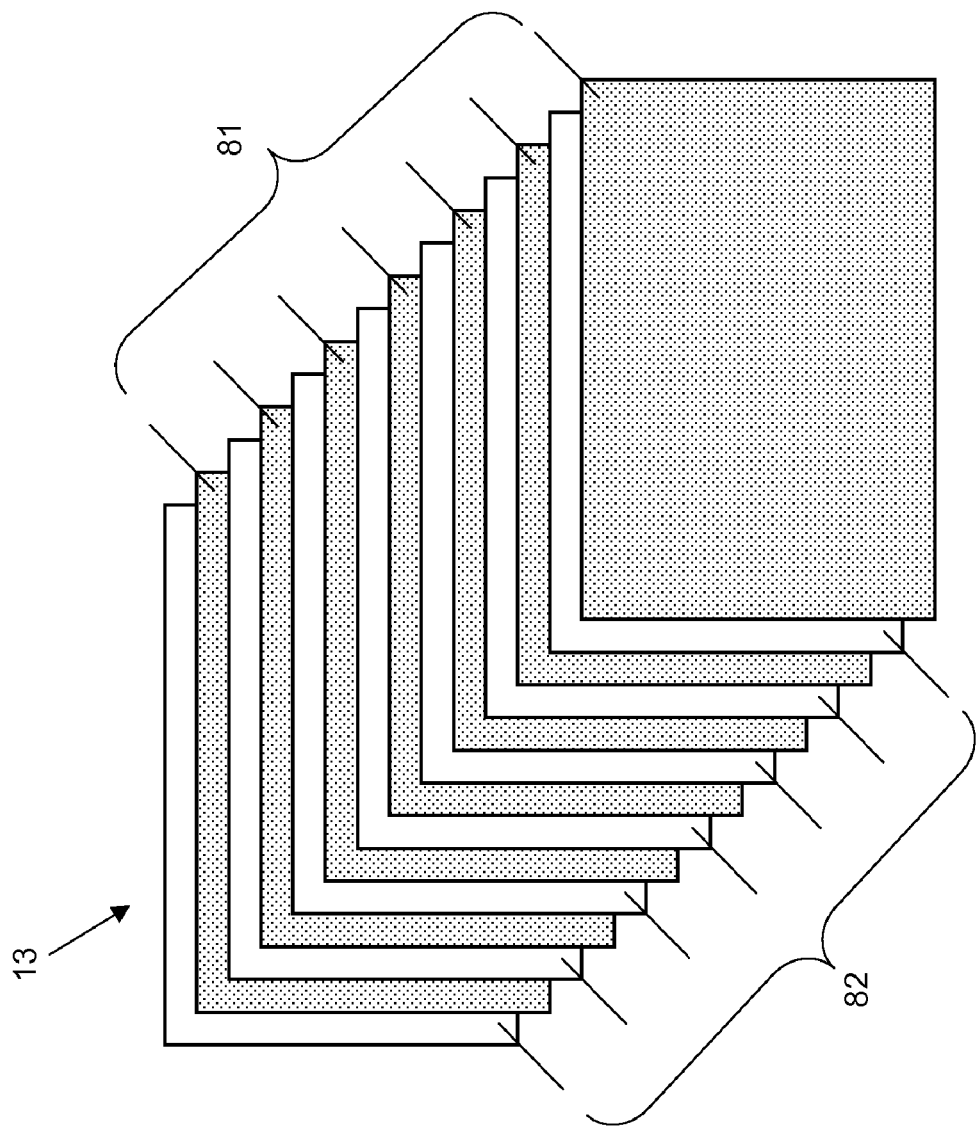
FIG. 8 is a schematic illustration of a plate pallet comprising plates separated by separation sheets.

The plate loading system 14 picks the top plate from the previously aligned plate pallet 13 (according to the methods disclosed in this invention). The plate loading system 14 detects the paper sheet 81 separating between the plates 82 in the plates pallet 13 (as is described in FIG. 8). The interleaf removal system 16 (a sub system of plate loading system 14) removes the separating paper sheet 81 from the plate. The separating paper sheet is being used for protecting the plate. The separating paper sheet 81 will be removed from the plate and will be ejected into the interleaf paper waste basket 62. The plate will be loaded by the plate loading system 14 through the connecting plate tray 61 directly into the imaging device 71 as is depicted in FIG. 7.

The invention has been described in detail with particular reference to certain preferred embodiments thereof, but it will be understood that variations and modifications can be effected within the scope of the invention.

PARTS LIST 10 plate pallet alignment and loading apparatus
11 plate pallet adaptor
12 position indicators
13 plate pallet
14 plate loading system
15 optical detectors
16 interleaf removal system
21 video camera
22 computer for analyzing captured video images
23 data and control line connecting between computer and video camera
31 mechanical detectors
41 elevator top plate
42 X axis tracks
43 angular movement actuator (angle @)
44 X axis actuator
45 Y axis actuator
46 Y axis tracks
47 pallet positioning system
48 rotation axis
52 axis coupled actuators
61 connecting plate tray
62 interleaf paper waste basket
71 imaging device
81 paper sheets separating between plates in a plates pallet
82 plates in the plates pallet (separated by paper sheets 81)

The invention claimed is:

1. A plate pallet alignment and loading apparatus loading for an originally packed plate pallet into a printing plate imaging device comprising:
   a plate loading system for loading the plates from said originally packed plate pallet into said printing plate imaging device;
   a plate pallet adaptor;
   a plate pallet position detector which detects a position of said plate pallet on said adaptor;
   a computer which compares said plate pallet position to a required position and generates an error signal based on a difference between said plate pallet position and said required position; and
   actuators for correcting said plate pallet position in response to said error signal.

2. The apparatus of claim 1 wherein said originally packed plate pallet is placed on top of said adaptor.

3. The apparatus of claim 1 wherein an interleaf removal system separates said plates and separation paper sheets placed between said plates.

4. The apparatus of claim 1 wherein said plate pallet position detectors detect position indicators attached to said plate pallet.

5. The apparatus of claim 1 wherein said plate pallet position detectors comprise optical detectors.

6. The apparatus of claim 1 wherein said plate pallet position detectors comprise mechanical detectors.

7. The apparatus of claim 1 wherein said plate pallet position detectors comprise induction detectors.

8. The apparatus of claim 1 wherein said plate pallet position detectors are selected from a group comprising optical, mechanical or induction detectors or combinations thereof.

9. The apparatus of claim 1 wherein said plate pallet position detectors comprise a video camera.

10. The apparatus of claim 9 wherein said computer is a microprocessor which analyzes images taken by said video camera.

11. The apparatus of claim 1 wherein said actuators comprise:
 an actuator for the X axis movement;
 an actuator for Y axis movement; and
 an actuator for angular movement.

12. The apparatus of claim 1 wherein the movement of a first actuator is coupled with the movement of a second actuator.

13. A method for plate pallet alignment for loading an originally packed plate pallet into a printing plate imaging device comprising:

mounting said plate pallet a plate pallet adaptor;
 detecting the position of said plate pallet on said adaptor;
 comparing said plate pallet position to a required position and generating an error signal based on a difference between said plate pallet position and said required position; and
 correcting said plate pallet position in response to said error signal.

* * * * *